United States Patent [19]

Senda et al.

[11] Patent Number: 4,833,004

[45] Date of Patent: May 23, 1989

[54] STRUCTURE OF COPPER CONDUCTOR AND METHOD OF FORMING SAME

[75] Inventors: Atsuo Senda, Ootsu; Tohru Kasanami; Takuji Nakagawa, both of Kyoto, all of Japan

[73] Assignee: Murata Manufacturing Co., Ltd., Japan

[21] Appl. No.: 337,979

[22] Filed: Jan. 8, 1982

Related U.S. Application Data

[62] Division of Ser. No. 194,980, Oct. 8, 1980, Pat. No. 4,328,048.

[51] Int. Cl.$^4$ ............................................. B32B 3/27
[52] U.S. Cl. .................................... 428/210; 174/68.5; 428/209; 428/432; 428/433; 428/544; 428/615; 428/620; 428/900
[58] Field of Search ............... 428/432, 469, 699, 702, 428/201, 209, 210, 204, 206, 212, 433, 544, 546, 548, 551, 567, 615, 620, 900; 427/98, 99, 38; 148/6.31; 174/68.5; 357/72

[56] References Cited

U.S. PATENT DOCUMENTS

| | | | |
|---|---|---|---|
| 3,846,152 | 11/1974 | Franz | 148/6.31 |
| 4,072,771 | 2/1978 | Grier, Sr. | 427/96 |
| 4,189,331 | 2/1980 | Roy | 148/6.31 |
| 4,311,729 | 1/1982 | Itakura et al. | 427/80 |

*Primary Examiner*—Ellis P. Robinson
*Assistant Examiner*—P. R. Schwartz
*Attorney, Agent, or Firm*—Ostrolenk, Faber, Gerb & Soffen

[57] ABSTRACT

A structure of a copper conductor is obtained by oxidizing copper film formed on the surface of a substrate, and by heat treating the same in a reducing atmosphere, whereby only the surface layer portion of the oxidized copper film is reduced to become copper. The copper film of a conductor is formed on the surface of the substrate with the oxidized copper film interposed therebetween. As a result, an adhesion of the copper film to the surface of the substrate is enhanced.

5 Claims, 2 Drawing Sheets

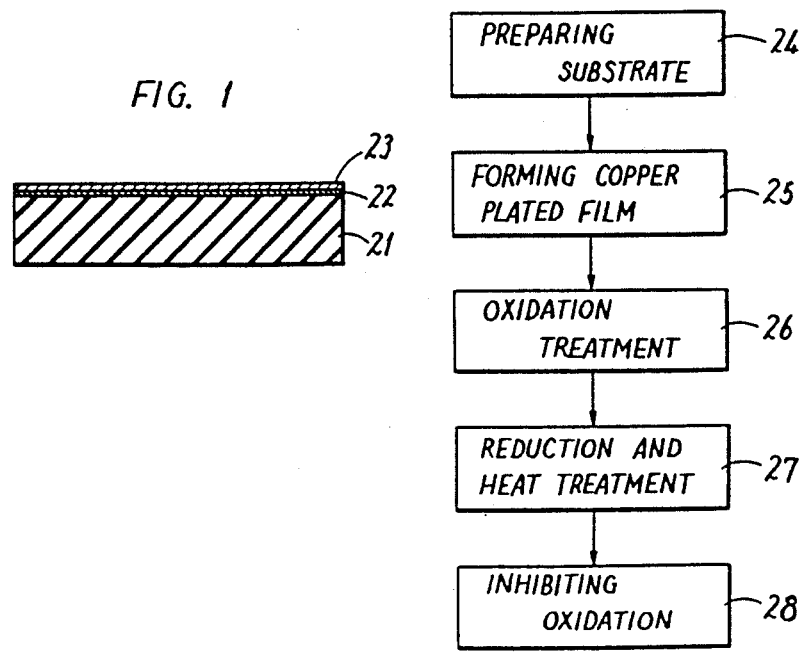

FIG. 3
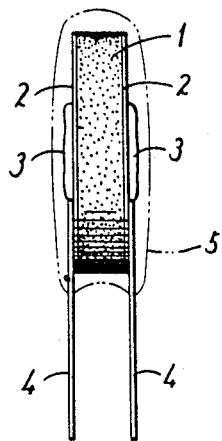
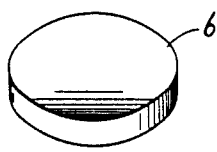
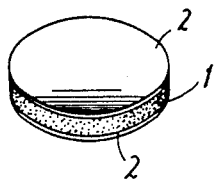
FIG. 4
FIG. 5
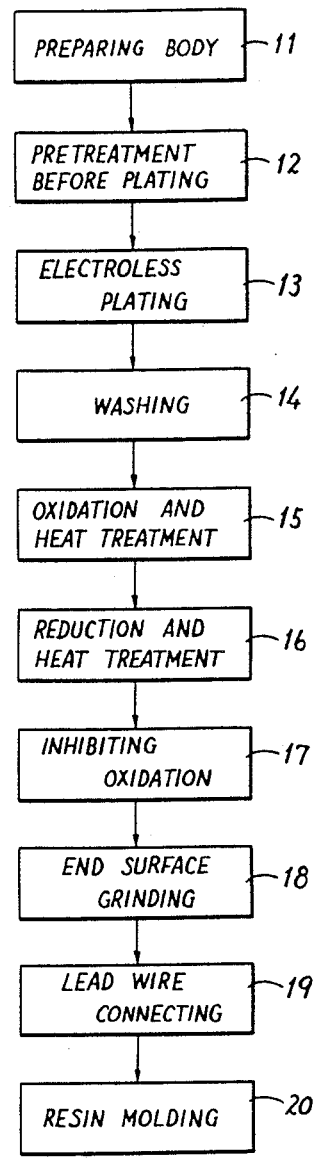
FIG. 6
PREPARING BODY — 11
↓
PRETREATMENT BEFORE PLATING — 12
↓
ELECTROLESS PLATING — 13
↓
WASHING — 14
↓
OXIDATION AND HEAT TREATMENT — 15
↓
REDUCTION AND HEAT TREATMENT — 16
↓
INHIBITING OXIDATION — 17
↓
END SURFACE GRINDING — 18
↓
LEAD WIRE CONNECTING — 19
↓
RESIN MOLDING — 20

STRUCTURE OF COPPER CONDUCTOR AND METHOD OF FORMING SAME

This is a division of application Ser. No. 194,980, filed on Oct. 8, 1980 now U.S. Pat. No. 4,328,048.

BACKGROUND OF THE INVENTION

1. Field of the Invention

The present invention relates to a structure of a copper conductor and a method of forming the same. More specifically, the present invention relates to a structure of a copper film formed on the surface of a substrate such as ceramics, metal, resin or the like, with a strengthened adhesion thereof to the surface of the substrate, and a method of forming the same.

2. Description of the Prior Art

A copper conductor attained in accordance with the present invention can be used as an electrode or a conductive device in various kinds of electronic circuit components. One example of a copper conductor of interest to the present invention is an electrode or electrodes of ceramic capacitors. The electrode of a ceramic capacitor was generally formed using silver of high conductivity. Such a silver electrode was formed by coating a silver paste on a ceramic body and by baking the same. However, with the recent rise of the cost of silver material, the ratio of the cost of such a silver electrode to the total cost of a ceramic capacitor increased. Thus, employment of such silver electrode became a cause of the rise of the total cost of ceramic capacitors.

In such situation, attention was given to development of an inexpensive electrode. As one approach, various studies were made as to methods for forming a metallic film, such as by electroless plating process, vacuum evaporation process, sputtering process, ion plating process, and the like. As another approach, study was made as to employment of inexpensive metal in substitution for silver as an electrode.

The first approach employed was a nickel plated electrode formed by means of an electroless plating process. A nickel plated electrode was successful to some extend as an inexpensive electrode as a substitution for a silver electrode. However, it was observed that employment of a nickel plated electrode as an electrode of ceramic capacitors involves the following problems. More specifically, the resistivity of a nickel electrode per se is $7.24 \times 10^{-6} \Omega.cm$, which is higher than that of silver which is $1.62 \times 10^{-6} \Omega.cm$. Accordingly, a problem is caused in that a frequency characteristc is degraded in the high frequency region. Another problem is that solderability of a nickel plated electrode is poor. Furthermore, another approach was attempted where the whole surface is coated with a solder layer in order to decrease the resistivity of the nickel plated electrode. However, in coating the whole surface of the electrode with a solder layer, a large amount of flux which is active must be used. Accordingly, it is necessary to cleanse the electrode to remove unnecessary flux after soldering. Furthermore, although in soldering the electrode portion is processed by dipping the same in a solder tub, for example, such process causes stress in the ceramics, so that a crack is liable to be caused in the ceramics.

Development of an inexpensive electrode that can be substituted for the above described nickel electrode was desired. Therefore, a new attempt was made with a copper electrode. However, a large obstacle was involved also in such copper electrode. More specifically, adhesion of a copper film constituting an electrode to a ceramic substrate is extremely poor. Copper has also been a typical example of metal having an adhesion to a ceramic substrate as poor as that of gold. However, in view of the fact that copper has a high conductivity, it can be said that copper is a preferred material for constituting an electrode or a conductive device, apart from the above described problem of a poor adhesion.

As a means for compensating for the above described problem involved in the adhesion of a copper film, conventionally an approach to be set forth in the following was employed. In the case where a copper film is formed by a vacuum evaporation process, for example, a so-called multilayer evaporation was employed in which a metal of a small atomic radius or a metal easily oxidized such as chromium, aluminium or the like is first evaporated on the surface of a ceramic substrate and then copper is evaporated thereon, whereby a copper film of a strong adhesion is attained. More specifically, through interposition of a metal of a small atomic radius or oxidized metal between a copper film and a ceramic substrate, a copper film stably adhered to a ceramic substrate was obtained. However, such approach involves an increased number of processing steps and can not be said to be a simple method.

Furthermore, in the case where a copper film is formed by an electroless plating process, a ceramic substrate is first dipped in a water solution of fluoric acid, for example, to apply an etching process thereto, so that the surface of the ceramic substrate is made uneven and then a copper film was formed. More specificaly, the adhesion of the copper film to the ceramic body was increased by an increased mechanical contacting force. However, when a ceramic substrate such as a dielectric, insulating, semiconductive or resistive meterial is subjected to an etchant such as fluoric acid, the surface of the ceramic substrate is corroded and as a result not only the function of the ceramic substrate is changed but also the same is degraded. Thus, such means is not preferred.

Meanwhile, the problem of a poor adhesion of a copper film is involved not only in case of formation thereof on a ceramic substrate but also formation thereof on metal, resin or the like.

SUMMARY OF THE INVENTION

In summary, the present invention comprises a method of forming a copper conductor, comprising the steps of forming a copper film on the surface of a substrate, oxidizing the copper film to form a oxidized copper film, and heat treating the oxidized copper film in a reducing atmosphere, thereby to reduce the surface layer portion of the oxidized copper film into copper, and a structure of a copper conductor thus obtained. According to the present invention, a conductor of a structure including a copper film formed on the surface of a substrate with a oxidized copper film interposed therebetween is obtained. The film formed on the surface of the substrate comprises a multilayer structure; however, such structure can be formed on the surface of the substrate using only one step of applying metal to the surface of the substrate.

In a preferred embodiment of the present invention, the substrate is made of ceramics. Oxidation of the copper film is carried out by heat treating the same in the air. The step of heat treating the oxidized copper is carried out in a nitrogen atmosphere.

In another preferred embodiment of the present invention, the substrate is made of metal, resin or the like. Oxidation of the copper film is carried out by applying an oxidizing agent. The reducing atmosphere for reducing the oxidized copper is comprised of hydrogen or carbon monoxide.

Accordingly, a principal object of the present invention is to provide a structure of a copper conductor and a method for forming the same, in which the adhesion of a copper film to a substrate is enhanced using a simple process Another object of the present invention is to provide a structure of a copper conductor and a method for forming the same, in which the adhesion of a copper film to various types of substrate is improved without employing metal other than copper.

A further object of the present invention is to provide a structure of a copper film and a method for forming the same, in which the adhesion of a copper film to a substrate is enhanced without regard to the kinds of the substrate and the means for forming the copper film.

These objects and other objects, features, aspects and advantages of the present invention will become more apparent from the following detaied description of the present invention when taken in conjunction with the accompanying drawings.

BRIEF DESCRIPTION OF THE DRAWINGS

FIG. 1 is an enlarged sectional view showing a structure of one embodiment of a copper conductor in accordance with the present invention;

FIG. 2 is a flow diagram showing the process of one embodiment for forming the FIG. 1 copper conductor;

FIG. 3 is a side view showing a ceramic capacitor in which the present invention can be advantageously employed;

FIG. 4 is a perspective view showing a ceramic body having a copper film formed on the whole surface thereof by an electroless plating process;

FIG. 5 is a perspective view showing a ceramic capacitor body having opposing electrodes formed by grinding the end surfaces of the FIG. 4 ceramic body; and FIG. 6 is a flow diagram showing the manufacturing process of the FIG. 3 ceramic capacitor.

DESCRIPTION OF THE PREFERRED EMBODIMENTS

Referring to FIG. 1, a oxidized copper film 22 is formed on the surface of a substrate 21. The substrate 21 may be made of an insulating, conductive, or semiconductive material. The material constituting the substrate 21 may be ceramics, metal, resin or the like. Meanwhile, in the case where the material constituting the substrate is resin, the same is preferably heat resistive so that the same may withstand the processing to be described subsequently. A copper film 23 is formed on the surface of the oxidized copper film 22.

Referring to FIG. 2, a method of forming the FIG. 1 structure will be described. The substrate 21 is prepared at the first step 24. Then a copper film is formed on the surface of the substrate 21 at the second step 25. As a method for forming a copper film, an electroless plating process, a vacuum evaporation process, a sputtering process an ion plating process, or the like is available. Any of these processes may be used for the purpose of the present invention. The thickness of the copper film formed at the second step 25 is selected to be approximately 2 $\mu$m, for example. Meanwhile, the copper film formed at the step 25 is to become the oxide copper film 22 and the copper film 23 shown in FIG. 1.

Then the copper film is treated for oxidation at the third step 26. The oxidizing process may be any one of a process of heat treating the copper film in the air, and a process of applying an oxidizing agent. The copper film turns to a film of oxidized copper e.g., $Cu_2O$ or $CuO$ in step 26. In the case where oxidationis carried out by heat treating the film in the air, the temperature condition is selected to be in the temperature range of 40° to 200° C. More preferably, the temperature condition is selected to be in the temperature range of 100° to 200° C. The reason is that at a temperature lower than 100° C., desired enhancement of the adhesion of the film to the substrate 21 is not attained, while at the temperature exceeding 200° C., reduction of the copper oxide film by heat treatment in a reducing atmospher in the following step can not attain a high conductivity copper film. Meanwhile, more preferably, the temperature condition is selected to be the temperature range of 100° to 160° C. An oxidizing agent for use in oxidizing treatment using such oxidizing agent may be hydrogen peroxide, potassium permanganate, or the like. Oxidizing treatment using such oxidizing agent may be carried out by a process of dipping the copper film in a water solution of the oxidizing agent, a process of coating or spraying such water solution on the copper film, or the like. In utilizing a water solution of hydrogen peroxide, preferably a water solution of 1 to 10% concentration is used.

At the fourth step 27, the oxidized copper film is heat treated in a reducing atmosphere such as nitrogen, hydrogen, or carbon monoxide. As a result, the oxidized copper portion on the surface layer portion of the oxidized copper film turns to copper.The surface layer portion is changed from the oxidized copper to copper becomes the copper film 23 shown in FIG. 1. The thin film contiguous to the surface of the substrate 21 is left as the oxidized copper without being reduced in the forth step 27. The layer left as the oxidized copper is the oxidized copper film 22 shown in FIG. 1. The oxidized copper film 22 is very thin and say as thin as approximately 500Å, for example. Existence of such very thin oxidized copper film 22 does not decrease the conductivity of the copper film 23. Meanwhile, the thickness of the copper film 23, and thus the thickness of the copper oxide film 22 can be controlled by the heat treatment condition at the fourth step 27. The heat treatment temperature is preferably higher than 500° C. in order to attain a high conductivity in the copper film 23.

The heat treatment in the reducing atmosphere at the fourth step 27 has the following result. More specifically, generally a copper film formed by an electroless plating process, a vacuum evaporation process, a sputtering process, an ion plating process or the like has a large resistivity as compared with that of bulk copper. Accordingly, such copper film needs be treated to become a copper film exhibiting an electric property close to that of pure copper. Such treatment is achieved by carrying out a heat treatment in an insert atmosphere. Such heat treatment can be achieved by the above described heat treatment at the fourth step 27.

At the fifth step 28, the copper film 23 is preferably treated for inhibition of oxidation. It has been observed that such oxidation inhibiting treatment can be effectively achieved by subjecting the copper film 23 to a hydrocarbon halide compound e.g. trichloroethylene, perchloroethylene, freon, chlorobenzene, methyl chloride, methylene chloride, chlorohform, carbon tetrachloride, or the like.

The structure obtained by the FIG. 2 process comprises the substrate 21, the copper film 23 formed thereon and the oxidized copper film 22 interposed therebetween, as shown in FIG. 1. More specifically, by oxidizing the copper film formed on the surface of the substrate 21, the whole portion of the film is first turned to a oxidized copper film but then the same is subjected to heat treatment in a reducing atmosphere at the following step, so that a surface layer portion of the oxidized copper film is turned to a copper film 23 of a pure copper state. By properly selecting the heat treatment condition in such reducing atmosphere, such as a heat treatment time and a heat treatment temperature, it is possible to interpose the oxidized copper film 22 in the interface between the substrate 21 and the copper film 23. As a result, an adhesion of the copper film 23 to the substrate 21 is enhanced. The reason of enhancement of the adhesion is presumably that a film of oxidized copper has a much better adheson to a substrate than that of a film of copper. In particular, in the case where the substrate is made of ceramics of oxidized metal, structural features and both resemble each other and therefore a much better adhesion can be attained.

Now several examples embodying the present invention will be described in the following.

Example 1

An alumina substrate of 60 mm in lenth, 30 mm in width and 0.5 mm in thickness was prepared and a conductive circuit of pure copper was formed in a desired pattern on the surface of the substrate using a vacuum evaporation process and a masking procedure.

Then the substrate was dipped in a 3% water solution of hydrogen peroxide. The diping ws continued in a wter solution of hydrogen peroxide at a ordinary temperature until the copper film becomes a film of oxidized copper exhibiting a brown hue.

Then the substrate was fully washed by water and was dried and then heat treated in nitrogen atmosphere at the temperatrue of 800° C.

An adhesive tape was then adhered onto a conductive circuit of the copper film thus formed on the surface of the alumina substrate and the tape was peeled off for the purpose of peel-off testing. As a result, the copper film was not peeled off and an excellent adhesion was confirmed.

Meanwhile, heat treatment was also carried out under the same condition on the sample which did not undergo the dipping process in a water solution of hydrogen peroxide and as a result it was observed that the adhesion of such copper film to the alumina substrate is not good and such composite can hardly be used for a longer period time.

Example 2

A substrate of 6 mm in diameter and 0.3 mm in thickness made of dielectric ceramic mainly including zirconium oxide was prepared and a copper film was formed on the surface thereof by an electroless plating process.

Then heat treatment was carried out in the air at the temperature of 160° C. until a oxidized copper film of a brown hue is formed.

Thereafter heat treatment is further carried out in a nitrogen atmosphere at the temperature of 800° C. until luster of pure copper is seen.

The adhesive strength of the copper film to the dielectric ceramic of the composite thus obtained was 2.5 to 3.3 kg/10 mm$^2$. Furthermore, since the copper film is formed on the whole surface of the dielectric ceramic substrate, the copper film portion on the peripheral side surface was removed to form a ceramic capacitor and an electric characteristic was measured. As a result, an improvement of the quality factor Q by 50% and an increase of a capacitance per unit area by 20 to 30% were observed as compared with a ceramic capacitor using silver as the elecrodes.

Meanwhile, heat treatment was also carried out in a nitrogen atmosphere under the same condition with respect to the composite which did not undergo the oxidizing heat treatment and the adhesive strength was 300 to 400 g/10 mm$^2$.

As is apparent from the above described embodiments, it is now clear that according to the present invention a copper conductor having a large adhesion to a substrate can be obtained. Accordingly, such copper conductor can be utilized as an electrode portion of a ceramic capacitor, as a conductive device of a circuit component, or as a copper film formed on metal, heat resistive resin such as polyimide resin, or the like.

Now a method of manufacturing a ceramic capacitor will be described in the following as an example of a ceramic electric circuit component where the inventive method can be employed. The inventive method can be utilized in a portion of the manufacturing process of such ceramic capacitor.

Referring to FIG. 3, the ceramic capacitor comprises a disk shaped ceramic body 1. Opposing electrodes 2 are formed on both major surfaces of the ceramic body 1. The electrodes 2 are formed as copper films. Lead wires 4 are connected to respective electrodes 2 by solders 3. The lead wires 4 are withdrawn in the radial direction, for example. Such structure is encapsuled using an insulating resin 5, as shown by a phantom line. The lead wires 4 are exposed from the insulating resin 5 for a predetermined length from the tip end, as a matter of course.

FIG. 6 shows one example of a process for manufacturing the FIG. 3 ceramic capacitor. Referring to FIG. 6, at the first step 11 the ceramic body is prepared. At the second step 12, pretreatment for an electroless plating process is applied to the ceramic body. The pretreatment comprises rinsing, activating and cleansing processes. At third step 13, copper is electroless plated on the surface of the pretreated ceramic body. As a result, a copper plated film is formed on the whole surface of the ceramic body. At the fourth step 14, the ceramic body having a copper film formed thereon is washed by water.

At the fifth step 15, heat treatment is carried out in the air for the purpose of oxidizng the copper film. The step 15 corresponds to the thrid step 26 shown in FIG. 2. At the sixth step 16, the oxidized copper film is heat treated in a reudcing atmosphere. The step 16 corresponds to the fourth step 27 in FIG. 2. At the seventh step 17, oxidation inhibiting treatment is carried out for the copper film obtained through reduction. The step 17 corresponds to the fifth step 28 in FIG. 2. After the seventh step 17, an intermediate product as shown in FIG. 4 is obtained. More specifically, the structure comprises a copper film 6 formed on the whole surface of the ceramic body. The eight step 18 is carried out to make the whole surface copper film 6 in the intermediate product be opposing electrodes 2 for a capacitor. The composite after the eight step 18 is shown in FIG. 5. More specifically, at the eight step 18 the outer peripheral end surface of the FIG. 4 intermediate product is ground, so that the ceramic body 1 may be exposed from the end surface. As a result, the copper film 6 turns into opposing electrodes 2. Meanwhile, although the oxidized copper films are disposed between the opposing electrodes 2 and the ceramic body 1, for simplicity of illustration, the copper oxide film has been omitted. The FIG. 5 strueture corresponds to the FIG. 3 structure including the ceramic body 1 and the opposing electrodes 2. Then in the step 19 and the tenth step 20 are in succession carried out, thereby to obtain a ceramic capacitor as shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A structure of a copper conductor consisting essentially of a ceramic substrate having a surface and a copper film directly formed on said surface of said substrate by electroless plating, vacuum evaporation, sputtering or ion plating, said copper film consisting of a first layer of oxidized copper and a second layer of reduced copper in the order of their nearness to said surface of said substrate, said oxidized copper of said first layer being obtained by oxidation of said copper film formed on said surface of said substrate, and said reduced copper of said second layer being obtained by reduction of said oxidized copper film formed by said oxidation.

2. A structure of a copper conductor in accordance with claim 1, wherein said ceramic is dielectric.

3. A structure of a copper conductor in accordance with claim 2, wherein said copper film is an electrode of a capacitor including said ceramic dielectric as said substrate.

4. A structure of a copper conductor in accordance with claim 1, wherein said ceramic in insulating.

5. A structure of a copper conductor in accordance with claim 4, wherein said copper film is a conductive portion of a circuit board including said insulating ceramic as said substrate.

* * * * *